US009723759B2

(12) United States Patent
Heydari et al.

(10) Patent No.: US 9,723,759 B2
(45) Date of Patent: Aug. 1, 2017

(54) COOLING SERVERS IN A DATA CENTER USING FANS EXTERNAL TO SERVERS (75) Inventors: Ali Heydari, Berkeley, CA (US); Seung Hoon Park, Fremont, CA (US); Amir Meir Michael, San Mateo, CA (US)

(73) Assignee: Facebook, Inc., Menlo Park, CA (US)

( * ) Notice: Subject to any disclaimer, the term of this patent is extended or adjusted under 35 U.S.C. 154(b) by 2105 days.

(21) Appl. No.: 12/628,143

(22) Filed: Nov. 30, 2009

(65) Prior Publication Data
US 2011/0128699 A1 Jun. 2, 2011

(51) Int. Cl.
F25D 23/12 (2006.01)
H05K 7/20 (2006.01)

(52) U.S. Cl.
CPC ..... H05K 7/20745 (2013.01); H05K 7/20836 (2013.01)

(58) Field of Classification Search
CPC .............. H05K 7/20836; H05K 7/20745
USPC ........ 62/259.2, 178, 186; 361/690, 694, 695; 236/49.3
See application file for complete search history.

(56) References Cited

U.S. PATENT DOCUMENTS

| | | | |
|---|---|---|---|
| 6,945,058 B2 * | 9/2005 | Bash et al. ................. | 62/89 |
| 7,262,964 B1 | 8/2007 | Barsun | |
| 7,430,118 B1 | 9/2008 | Noteboom et al. | |
| 7,486,511 B1 | 2/2009 | Griffel et al. | |
| 7,957,142 B2 | 6/2011 | Noteboom et al. | |
| 8,248,793 B2 | 8/2012 | Bash et al. | |
| 8,270,154 B2 | 9/2012 | Andersen et al. | |
| 8,270,155 B2 * | 9/2012 | Tipley ................. | 361/679.47 |
| 8,464,961 B2 | 6/2013 | Wu et al. | |
| 8,467,906 B2 | 6/2013 | Michael et al. | |
| 8,488,313 B2 | 7/2013 | Lin | |
| 8,605,427 B2 | 12/2013 | Chen et al. | |
| 2002/0108386 A1 * | 8/2002 | Spinazzola et al. ......... | 62/259.2 |
| 2004/0055322 A1 | 3/2004 | Monfarad | |
| 2006/0168975 A1 * | 8/2006 | Malone et al. .................. | 62/180 |
| 2007/0089011 A1 * | 4/2007 | Dodeja et al. ................. | 714/742 |
| 2007/0097636 A1 * | 5/2007 | Johnson et al. .............. | 361/695 |
| 2007/0213000 A1 | 9/2007 | Day | |
| 2008/0002358 A1 | 1/2008 | Casebolt | |
| 2008/0185446 A1 * | 8/2008 | Tozer ........................... | 236/49.4 |
| 2009/0133866 A1 * | 5/2009 | Campbell et al. ............ | 165/288 |
| 2009/0154104 A1 * | 6/2009 | Kondo et al. ................. | 361/700 |
| 2009/0168345 A1 * | 7/2009 | Martini ........................ | 361/691 |

(Continued)

OTHER PUBLICATIONS

PCT International Search Report and Written Opinion, PCT Application No. PCT/US2010/057861, Jan. 20, 2011, nine pages.

*Primary Examiner* — Len Tran
*Assistant Examiner* — Ana Vazquez
(74) *Attorney, Agent, or Firm* — Fenwick & West LLP (57) ABSTRACT To avoid the need to operate in-chassis fans to cool rack-mounted servers in a data center, the data center is arranged into a hot aisle and a cold aisle. The cold aisle is adjacent to a first side of the rack mounted servers and receives cold air from a cold air supply unit. The hot aisle is adjacent to a second side of the rack-mounted servers and has a lower pressure than the cold aisle. Because of the pressure difference between the cold aisle and the hot aisle, cold air flows through the rack-mounted servers, cooling electronic equipment therein, into the hot aisle. Control systems are used to obtain sufficient cooling.

27 Claims, 3 Drawing Sheets

(56) References Cited

U.S. PATENT DOCUMENTS

| | | |
|---|---|---|
| 2009/0173473 A1 | 7/2009 | Day |
| 2009/0255653 A1 | 10/2009 | Mills et al. |
| 2009/0302991 A1 | 12/2009 | Neilly et al. |
| 2009/0312877 A1 | 12/2009 | Chi-Wei et al. |
| 2010/0002385 A1 | 1/2010 | Lyon et al. |
| 2010/0027216 A1 | 2/2010 | Matsushima et al. |
| 2010/0155047 A1 | 6/2010 | Lin et al. |
| 2010/0167636 A1 | 7/2010 | Bhattacharya et al. |
| 2010/0175851 A1 | 7/2010 | Heydari et al. |
| 2010/0188810 A1 | 7/2010 | Andersen et al. |
| 2011/0083824 A1 | 4/2011 | Rogers |
| 2011/0128699 A1 | 6/2011 | Heydari et al. |
| 2011/0154842 A1 | 6/2011 | Heydari et al. |
| 2011/0184568 A1 | 7/2011 | Tai et al. |
| 2011/0235272 A1 | 9/2011 | Bash et al. |
| 2011/0245976 A1 | 10/2011 | Thompson et al. |
| 2012/0041600 A1 | 2/2012 | Michael et al. |
| 2012/0061054 A1 | 3/2012 | Katz et al. |
| 2012/0068811 A1 | 3/2012 | Neilly et al. |
| 2012/0168145 A1 | 7/2012 | Peterson et al. |
| 2012/0199764 A1 | 8/2012 | Girouard |
| 2012/0215359 A1 | 8/2012 | Michael et al. |
| 2012/0251966 A1 | 10/2012 | Yoshii et al. |
| 2012/0307440 A1 | 12/2012 | Franz et al. |
| 2013/0083481 A1 | 4/2013 | Goto et al. |
| 2013/0138252 A1 | 5/2013 | Chainer et al. |

\* cited by examiner

COOLING SERVERS IN A DATA CENTER USING FANS EXTERNAL TO SERVERS

BACKGROUND

This invention relates generally to data centers, and more particularly to efficient cooling of computing devices within a data center.

Heat removal is a prominent factor in computer system and data center design. The number of servers deployed in a data center has steadily increased while the increase in server performance has increased the heat generated by the electronic components in the servers during operation. Because the reliability of servers used by the data center decreases if they are permitted to operate at a high temperature over time, a portion of the data center's power is used for cooling electronics in the servers. As the number or servers included in a data center increases, a greater portion of the power consumed by the data center is used to cool electronics within the server.

Conventionally, the servers in the data center are individually equipped with a cooling system to dissipate heat produced during operation. Commonly, each server includes a fan to dissipate heat generated by the server during operation. However, these internal fans generally consume about 10%-15% of the power used by the servers, and they also produce heat during operation, thereby limiting the ability of these fans to dissipate heat.

SUMMARY

Embodiments of the invention reduce or eliminate the need for internal fans to cool servers in a data center, at least under normal operating conditions. In one embodiment, a data center includes a cold aisle that receives cold air, where the cold aisle is adjacent to one side of a set of servers. A hot aisle adjacent to another side of the servers has a pressure less than the pressure of the cold aisle. This pressure difference between the cold aisle and the hot aisle causes cold air to flow from the cold aisle through the server to the hot aisle, thereby cooling the electronic components in the servers (and heating the air flow). In an embodiment, a cold air supply unit that is external to the servers, such as a fan, supplies the cold air to the cold aisle from a cooling system and causes the pressure difference. Additionally, the hot aisle may include one or more exhaust units that are external to the servers. The exhaust units circulate air from the hot aisle and thus help produce the pressure difference that causes the circulation of the air through the servers. The heated air from the hot aisle may be cooled and then recirculated through the cold aisle, or the cool air may be obtained elsewhere, such as ambient air.

In one embodiment, a sensor monitors air temperature or air flow proximate to the server and adjusts the flow of cold air into the cold aisle accordingly. For example, if the temperature near the server reaches a threshold value or the airflow near the server reaches a threshold flow rate, the sensor communicates with a control system, which produces a control signal increasing the rate at which cold air is supplied to the cold aisle or modifying the direction in which cold air flows into the cold aisle. In another embodiment, the server includes an internal fan and an internal fan control system. The internal fan remains inactive until the fan control system determines that the temperature within the server equals a threshold temperature and activates the internal fan to augment the airflow through the server.

The figures depict various embodiments of the present invention for purposes of illustration only. One skilled in the art will readily recognize from the following discussion that alternative embodiments of the structures and methods illustrated herein may be employed without departing from the principles of the invention described herein.

DETAILED DESCRIPTION

Data Center Architecture

Figure 1:
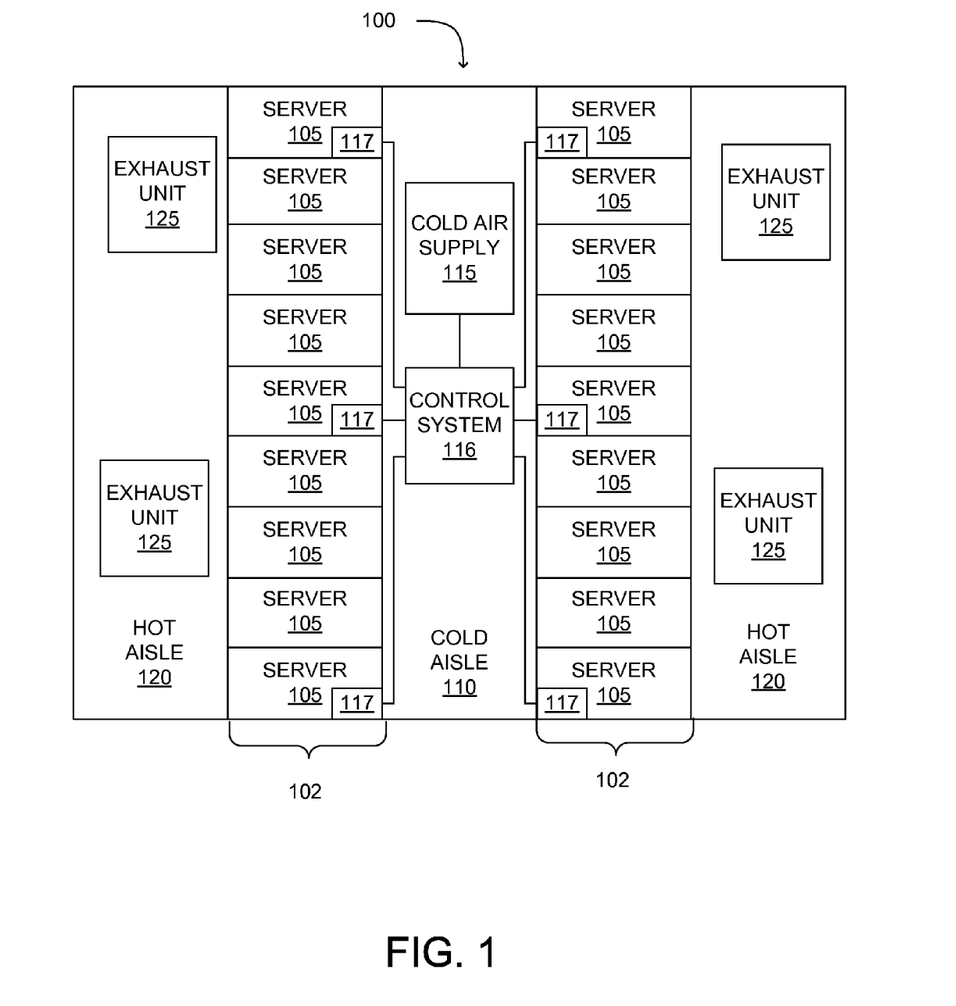
FIG. 1 is an overhead view of a data center for cooling servers without relying on internal fans in accordance with an embodiment of the invention.

An example data center 100 cooling one or more servers 105 is illustrated in FIG. 1. In one embodiment, a cold aisle 110 is adjacent to a first side of a partition 102 and a hot aisle 120 is adjacent to a second side of the partition 102. In an embodiment, the partition 102 includes one or more servers 105 oriented so that a first side of the one or more servers 105 is adjacent to the cold aisle 110 and a second side of the one or more servers 105 is adjacent to the hot aisle 120. The cold aisle 110 includes a cold air supply 115 while, in an embodiment, the hot aisle 120 includes one or more exhaust units 125. Additionally, one or more sensors 117 are proximate to a server 105, are included in the cold aisle 110 and/or are included in the hot aisle 120.

The partition 102 includes one or more openings though which air is able to flow. In an embodiment, the partition 102 comprises a rack or other structure to which one or more devices, such as one or more servers 105 or other electronic devices, may be attached. For example, the one or more servers 105 are mounted to one or more racks and may have different sizes, such as 1.5-2 rack units ("U"). The partition 102 is designed to increase airflow through the servers 105 that are included within the partition 102. For example, the partition 102 includes a server rack that is designed to increase the amount of air directed through the servers 105 included in the rack.

A server 105 has one or more input openings on a first side and one or more output openings on a second side adjacent. A server 105 is oriented so the one or more input openings are adjacent to the cold aisle 110 and the one or more output openings are adjacent to the hot aisle 120. Air from the cold aisle 110 enters the server 105 via the one or more input openings, travels through the server 105 and exits the server through the one or more output openings into the hot aisle 120. Hence, the input and output openings allow air to travel through the server 105 to cool components included in the server 105. An example server 105 is further described below in conjunction with FIGS. 3A and 3B.

Cold air is supplied to the cold aisle 110 from a cold air supply 115, such as a large fan or other air distribution device. In an embodiment, the cold air supply 115 is coupled to a cooling system, further described below in conjunction with FIG. 2. As used herein, "cold air" may refer to air having a temperature less than an ambient air temperature, air having a temperature below a specified temperature, or air having a lower relative temperature than air in a different region. For example, air included in the cold aisle 110, referred to as "cold air," has a first temperature, while air included in the hot aisle 120, referred to has "hot air," has a second temperature that is higher than the first temperature. In different embodiments, the position of the cold air supply 115 relative to the cold aisle 110 may differ. For example, the cold air supply 115 may be positioned above, below, or to the side of the cold aisle 110. Additionally, in some embodiments, multiple cold air supplies 115 provide cold air to the cold aisle 110 and may have different positions relative to the cold aisle 110. For example, cold air supplies 115 are positioned above and below or below and to the side of the cold aisle 110. For purposes of illustration, FIG. 1 shows an implementation with a cold air supply 110 positioned above the cold aisle 110. As a result of the cold air supply 115, the cold aisle 110 has a higher pressure than a hot aisle 120, and this pressure difference causes cold air to flow from the higher pressure cold aisle 110 through the one or more input openings of a server 105 or the partition 102 to the lower pressure hot aisle 120.

In an embodiment, the partition 102 is configured so that air flow paths external to the servers 105 are substantially blocked such that the airflow path of least resistance from the cold aisle 110 to the hot aisle 120 is through the servers 105. Configuring the partition 102 so that the airflow path of least resistance is through the servers 105 allows more efficient server 105 cooling by increasing the amount of air passing through the servers 105. In another embodiment, the partition 102 blocks substantially all airflow from the cold aisle 110 to the hot aisle 120 except for the airflow through the servers 105, so that substantially all of the airflow from the cold aisle 110 to the hot aisle 120 is through the servers 105. To facilitate airflow from the cold aisle 110 to the hot aisle, in one embodiment the cold aisle 110 may be pressurized while the hot aisle 120 is depressurized to facilitate airflow from the cold aisle 110 to the hot aisle 120. As the cold air passes through the server 105, it flows over components within the server 105, dissipating heat generated from operation of the electric components in the servers 105.

In different embodiments, the cold air supply 115 may statically or dynamically control the amount of air supplied to the cold aisle 110 to modify the airflow through the servers 105. In an embodiment where the air supply is statically controlled, the cold air supply 115 is louver-based and supplies cold air in different directions, at different flow rates, and/or at different temperature levels. In an alternative embodiment, the cold air supply 115 dynamically modifies the airflow supplied to the cold aisle 110 by changing the speed of one or more supply fans, repositioning one or more air supply louvers (or otherwise redirecting the airflow), or changing the temperature to which the airflow is cooled. Modifying the supply fan speed, supply louver position, and/or air temperature allows the cold air supply 115 to more suitably cool the servers 105 included in the partition 102. Hence, implementations of the cold air supply 115 allow non-uniform air flow and/or air temperature throughout the cold aisle 110, enabling different locations within the cold aisle 110, such as locations proximate to different servers 105, to have a different air flow rate and/or a different air temperature. Additionally, the air flow from the cold air supply 115 may be determined or modified based on the size of the servers 105 being cooled.

After flowing through the servers 105, cold air enters the hot aisle 120 because it has a lower pressure than the cold aisle 110. Because the air extracts heat from components within one or more servers 105, when passing from the cold aisle 110 to the hot aisle 120, the air temperature increases so that air in the hot aisle 120 has a higher temperature than air in the cold aisle 110. In an embodiment, the hot aisle 120 includes one or more exhaust units 125, such as exhaust fans, which extract air from the hot aisle 120. While FIG. 1 shows an example hot aisle 120 with two exhaust units 125, in other embodiments, the hot aisle may include a different number of exhaust units 125. In an embodiment, the exhaust unit 125 is coupled to a cooling system, further described below in conjunction with FIG. 2, so that air flows from the hot aisle 120 into the one or more exhaust units 125 and into the cooling system, where it is cooled and recirculated into the cold aisle 110 via the cold air supply 115. Alternatively, cold air enters the hot aisle 120 and is directed outside of the data center 100.

The data center 100 also includes one or more sensors 117 in locations where air flows from the cold aisle 110 to the hot aisle 120. The sensors 117 monitor air flow, air temperature, air humidity, absolute air pressure, differential air pressure, or any other data that describes air flow or air temperature, and combinations thereof. In an embodiment, the sensors 117 are placed in locations where airflow is likely to be less than other locations, such as a ceiling or a wall where the partition 102 abuts another surface, so that the temperature of the sensor locations is likely to be higher than other locations. For example, sensors 117 are placed in corners of the cold aisle 110 to monitor airflow through the corners, the temperature of the corners, the pressure difference between the cold aisle 110 and the hot aisle 120 or another value characterizing air flow through the sensor location. In another embodiment, sensors 117 are positioned at locations within the cold aisle 110, at locations within the hot aisle 120, at locations within one or more servers 105 or in any combination of the above-described locations.

The sensors 117 communicate with a control system 116 coupled to, or included in, the cooling system and/or the cold air supply 115 to modify how air is cooled by the cooling system or how cold air is supplied to the cold aisle 110 by the cold air supply 115. The control system 116 generates a control signal responsive to data from one or more sensors 117 to modify operation of the cooling system and/or the cold air supply 115. For example, responsive to detecting a temperature reaching a threshold value, an air flow reaching a threshold flow rate, or a pressure difference between the cold aisle 110 and the hot aisle 120 falling below a threshold value, a sensor 117 communicates with the control system 116, which generates a control signal increasing the rate at which the cold air supply 115 supplied to the cold aisle 110 or modifying the direction in which cold air is supplied to the cold aisle 110 by the cold air supply 115. Hence, the sensors 117 and control system 116 implement a feedback loop allowing the data center 100 to modify how cold air flows through the servers 105 responsive to changes in the data center environment, improving the cooling efficiency.

Figure 2:
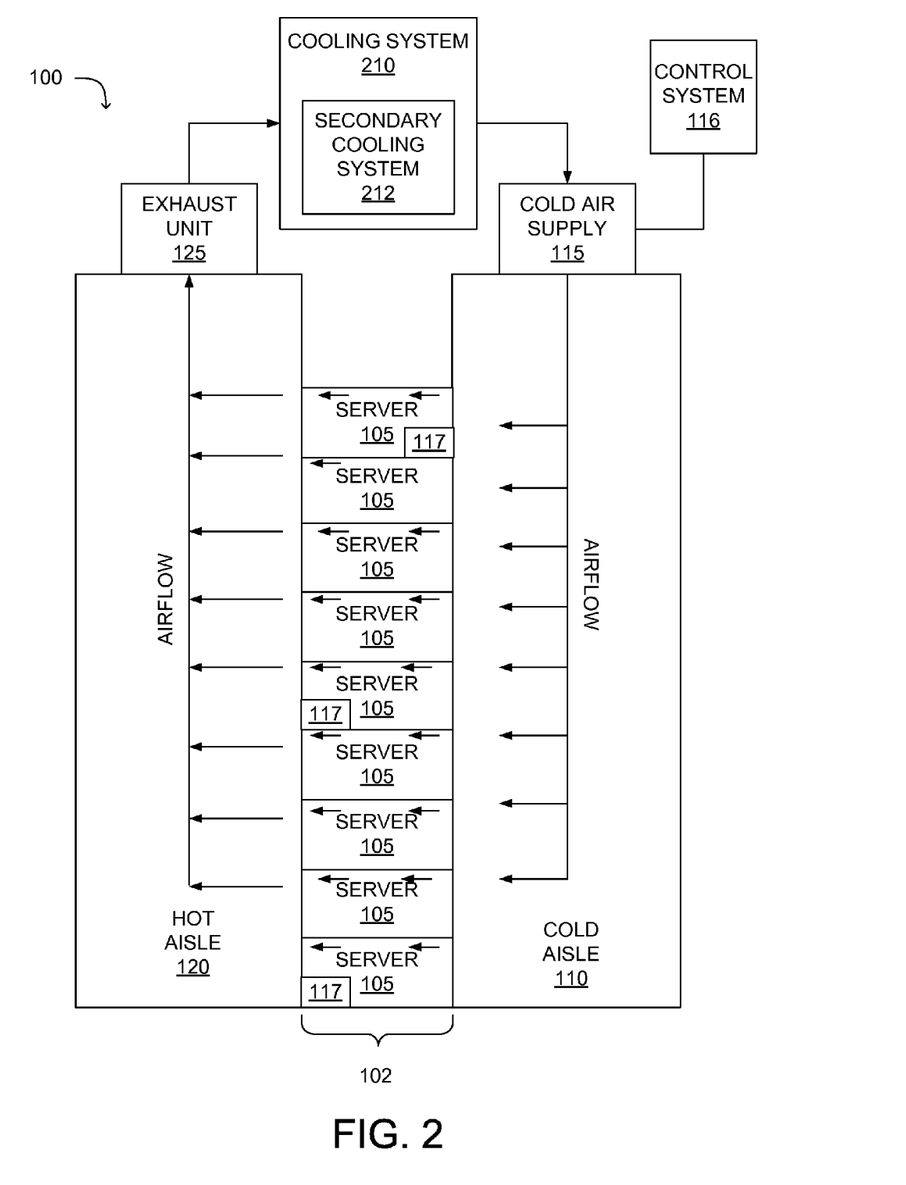
FIG. 2 is a side view of a data center for cooling servers without relying on internal fans showing airflow throughout the data center in accordance with an embodiment of the invention.

FIG. 2 is a side view of the airflow in data center 100 that is capable of cooling the servers 105 without depending on fans within the servers 105, according to one embodiment. The arrows indicate the flow of air throughout the data center 100. As illustrated, a cooling system 210 is coupled to a cold air supply 115 and to an exhaust unit 125. While FIG. 2 shows a single cold air supply 115 and a single exhaust unit 125, other embodiments may have multiple cold air supplies 115 and/or multiple exhaust units 125.

The cooling system 210 comprises a Heating, Ventilating and Air Conditioning ("HVAC") system, which extracts heat from air. For example, the cooling system 210 uses free-air cooling, such as air-side or liquid-side economization to cool the air. In an embodiment, the cooling system 210 includes secondary cooling systems 212, such as an evaporative cooling system, an absorption cooling system, an adsorption cooling system, a vapor-compression cooling system, or another cooling system to extract heat from air. In another embodiment, the cooling system 210 also modifies the humidity of the cool air to improve reliability and/or longevity of the servers 105 being cooled. For example, the cooling system 210 produces cold air having a humidity within a specified range, such as 20% to 60% humidity, to the cold aisle 110.

In one embodiment, the cooling system 210 receives heat from the exhaust units 125 included in the hot aisle 120, cools and dehumidifies the received air, and supplies the cooled and dehumidified air to the cold air supply 115, where it is supplied to the cold aisle 110. In this embodiment, the cooling system 210 is a closed system 210, which recirculates air from the hot aisle 120 to the cold aisle 110 once the air is cooled and dehumidified. As illustrated by the arrows in FIG. 2, the cooled air travels from the cooling system 210 to the cold air supply 115, which supplies the cold air to the cold aisle 110. In an embodiment, the cold air supply 115 comprises one or more fans or one or more air nozzles, one or more air jets, or other device for directing air flow.

Cooled air from the cold air supply 115 enters the cold aisle 110. Because the cold aisle 110 has a higher pressure than the hot aisle 120, and the partition 102 includes one or more openings for air flow, the cold air flows from the cold aisle 110 to the lower pressure hot aisle 120. To flow from the cold aisle 110 to the hot aisle 120, the cold air passes through the openings in the partition 102, so that the cold air is drawn through the partition 102. In an embodiment, the partition 102 includes one or more servers 105 that have one or more input openings on a first side adjacent to the cold aisle 110 and one or more output openings on a second side adjacent to the hot aisle 120. The input openings allow cold air to enter the server 105, travel through the server 105, flowing over components within the server 105. After traveling through the server 105, the output openings enable air to exit the server 105 into the hot aisle 120.

As cool air travels through the partition 102 and/or a server 105 from the cold aisle 110 to the hot aisle 120, a portion of the air travels across, or through, one or more sensors 117 which monitor attributes of the airflow, such as air temperature, air humidity, absolute air pressure of the cold aisle 110 or of the hot aisle 120, or a pressure difference between the cold aisle 110 and the hot aisle 120. The sensors 117 communicate the monitored attributes to a control system 116, which is coupled to or included in, the cold air supply 115 or the cooling system 210. The control system 116 generates a control signal modifying operation of the cold air supply 115 and/or the cooling system 210 to modify the cold air supplied to the cold aisle 110. For example, responsive to a sensor 117 detecting a temperature above a threshold value, an air flow below a threshold flow rate or a pressure difference between the cold aisle 110 and the hot aisle 120 falling below a threshold value, the control system 116 generates a control signal increasing the rate or direction at which the cold air supply 115 supplies cold air to the cold aisle 110 or generates a control signal directing cold air from the cold air supply 115 towards certain areas in the cold aisle 110 needing increased cooling. For example, the control signal causes the cold air supply 115 to more cold air towards a region of the partition 102 where a sensor 117 indicates a temperature above a threshold value or an airflow rate below a threshold value. Alternatively, the control system 116 generates a control signal causing the cooling system 210 to further reduce the temperature of the air provided to the cold aisle 110.

One or more exhaust units 125 are included in the hot aisle 120 to extract air from the hot aisle 120 and to direct air from the hot aisle 120 to the cooling system 210, where the air is again cooled. Hence, the one or more exhaust units 125 implement a closed-loop where air is cooled by the cooling system 210 and recirculated to the cold aisle 110 via the cold air supply 115. Because the pressure differential between cold aisle 110 and hot aisle 120 causes air to flow through the partition 102, and electronic devices included in the partition 102, electronic devices included in the data center 100 are cooled without relying on air moving devices, such as fans, operating at individual electronic devices. Additionally, reducing the use of locally-implemented air moving devices reduces power consumption of the electronic devices, making the data center 100 more power efficient.

Server Design

Figure 3A:
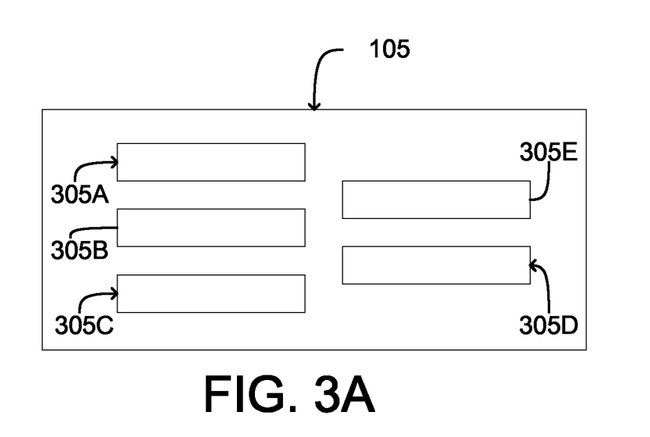
FIG. 3A is a front view of an example server in accordance with an embodiment of the invention.

To use the airflow from the cold aisle 110 to the hot aisle 120 in an efficient manner, a server 105 may internally channel airflow to cool components within the server 105. Components within the server 105 may be oriented so that the airflow is increased over components with higher operating temperatures. In an embodiment, the server includes additional physical elements, such as one or more air dams, that redirect airflow within the server 105 to increase airflow over components with higher operating temperatures. FIG. 3A is a front view of one embodiment of a server 105 illustrating input openings 305 for cold air. In one embodiment, the server 105 includes multiple input openings 305A, 305B, 305C, 305D, 305E to increase the amount of air flowing through the server 105. For example, the server 105 is positioned on the partition 102 so that the input openings 305A-305E are adjacent to the cold aisle 110. Because of the pressure difference between the cold aisle 110 and the hot aisle 120, air flows from the higher pressure cold aisle 110 through the input openings 305A-305E to reach the hot aisle 120.

The placement of components within the server 105 and the amount of heat generated by the components within the server 105 and/or desired maximum temperature of components within the server 105 may also be used to determine the air flow to be supplied by the data center 100 for cooling. For example, the placement and operating temperature of components within the server 105 is used when determining the temperature, flow rate or directionality, or cold air supplied to the cold aisle 110 by the cold air supply 115. In an embodiment, a sensor 117 included in a server 105 monitors the temperature of one or more components within the server 105 and communicates the temperature to a control system 116 which generates a control signal modifying the cold air provided to the cold aisle 110 by the cold air supply 115.

Figure 3B:
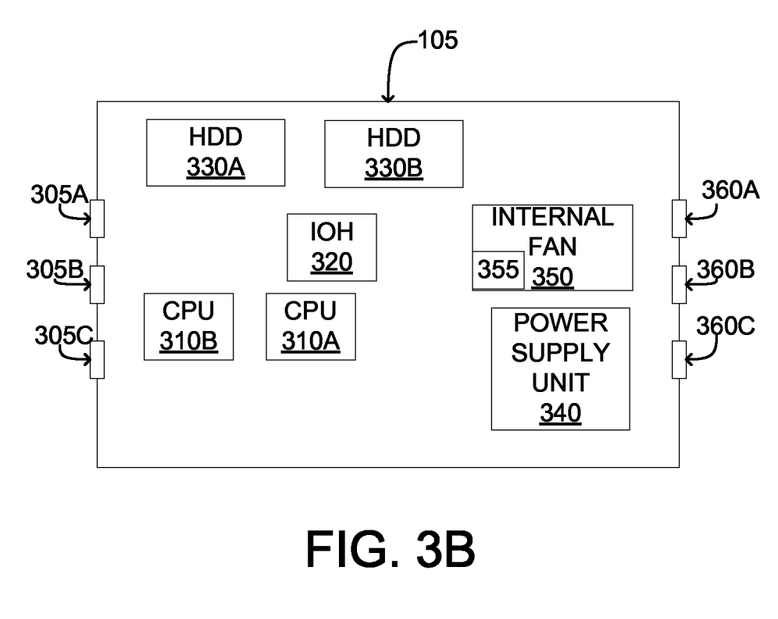
FIG. 3B is an overhead view of components within an example server in accordance with an embodiment of the invention.

FIG. 3B is an overhead view of components within one embodiment of a server 105 for use in a data center in accordance with an embodiment of the invention. Components within the server 105 are arranged so that a high percentage of the air flowing through the server 105 flows across the components having higher operating temperature. In an embodiment, the server 105 includes one or more processors 310A, 310B, an input/output hub 320, one or more hard drives 330A, 330B an internal fan 350 and a fan control system 355 which receive power form a power supply unit 340. The components shown in FIG. 3B are examples, and in other embodiments the server 105 includes additional and/or different components.

The processors 310A, 310B and the input/output hub 320 are proximate to the input openings 305A-305C so that cold air flows across the one or more processors 310A, 310B and the input/output hub 230 to cool the components. In an embodiment, one or more heat sinks are coupled to the processors 310A, 310B to increase the surface area over which heat generated by a processor 310 is radiated. Cold air entering from one or more of the input openings 305A-305C flows over the one or more processors 310 and the input/output hub 320 to carry generated heat away from the one or more processors 310 and the input/output hub 320. Movement of the cold air carries the heat out of the interior of the server 105 through the one or more output openings 360A, 360B, 360C. In one embodiment, the one or more output openings 360A-360C output air into a hot aisle 120.

In an embodiment, the hard drives 330A, 330B are positioned within the interior of the server 105 to help direct the airflow across components having a higher operating temperature, such as the processors 310A, 310B and input/output hub 320. Additionally, the interior of the server 105 may include additional components to direct the airflow from the input openings 305A-306C through the interior of the server 105.

In another embodiment, the server 105 does not include an internal fan 350 is configured so that airflow through the server 105 from the cold aisle 110 through the server 105 to the hot aisle 102 cools components within the server 105. In this configuration, movement of cold air from the cold aisle through the server 105 carries heat out of the interior of the server 105 through the out or more output openings 360A, 360B, 360C. In an alternative embodiment, the server 105 may also include an internal fan 350 and an internal fan control system 355 to provide a redundant cooling system for the server 105. The internal fan 350 is generally in a power-off state is activated responsive to a command from the internal fan control system 355. In an embodiment, the internal fan control system 355 monitors the temperature of one or more components, such as a processor 310 or a motherboard, inside the server 105. Responsive to the temperature of one or more of the monitored components equaling a threshold value, the internal fan control system 355 activates the internal fan control system 355 to supplement the airflow through the server 105 and further cool components within the server 105. Alternatively, the internal fan control system 355 determines the air pressure near the input openings 305 and the air pressure near the output openings 360 and activates the internal fan control system 355 responsive to the pressure difference or responsive to the air pressure near the input openings 305 or near the output openings 360. In another implementation, the internal fan control system 355 communicates with one or more sensors 117 outside of the server 105 and activates the internal fan 350 responsive to receiving data from the one or more sensors 117 about external air pressure or temperature external to the server 105. Hence, the internal fan 350 provides the server 105 with an auxiliary cooling device supplementing airflow from the cold aisle 110 through the server 105 to the hot aisle 120. This may be useful, for example, if the externally driven airflow is not sufficient or not cold enough to cool the components within the server 105.

SUMMARY

The foregoing description of the embodiments of the invention has been presented for the purpose of illustration; it is not intended to be exhaustive or to limit the invention to the precise forms disclosed. Persons skilled in the relevant art can appreciate that many modifications and variations are possible in light of the above disclosure.

Some portions of this description describe the embodiments of the invention in terms of algorithms and symbolic representations of operations on information. These algorithmic descriptions and representations are commonly used by those skilled in the data processing arts to convey the substance of their work effectively to others skilled in the art. These operations, while described functionally, computationally, or logically, are understood to be implemented by computer programs or equivalent electrical circuits, microcode, or the like. Furthermore, it has also proven convenient at times, to refer to these arrangements of operations as modules, without loss of generality. The described operations and their associated modules may be embodied in software, firmware, hardware, or any combinations thereof.

Any of the steps, operations, or processes described herein may be performed or implemented with one or more hardware or software modules, alone or in combination with other devices. In one embodiment, a software module is implemented with a computer program product comprising a computer-readable medium containing computer program code, which can be executed by a computer processor for performing any or all of the steps, operations, or processes described.

Embodiments of the invention may also relate to an apparatus for performing the operations herein. This apparatus may be specially constructed for the required purposes, and/or it may comprise a general-purpose computing device selectively activated or reconfigured by a computer program stored in the computer. Such a computer program may be stored in a tangible computer readable storage medium, which include any type of tangible media suitable for storing electronic instructions, and coupled to a computer system bus. Furthermore, any computing systems referred to in the specification may include a single processor or may be architectures employing multiple processor designs for increased computing capability.

Embodiments of the invention may also relate to a computer data signal embodied in a carrier wave, where the computer data signal includes any embodiment of a computer program product or other data combination described herein. The computer data signal is a product that is presented in a tangible medium or carrier wave and modulated or otherwise encoded in the carrier wave, which is tangible, and transmitted according to any suitable transmission method.

Finally, the language used in the specification has been principally selected for readability and instructional purposes, and it may not have been selected to delineate or circumscribe the inventive subject matter. It is therefore intended that the scope of the invention be limited not by this detailed description, but rather by any claims that issue on an application based hereon. Accordingly, the disclosure of the embodiments of the invention is intended to be illustrative, but not limiting, of the scope of the invention, which is set forth in the following claims.

What is claimed is:

1. A data center system comprising:
    a partition arranged between a cold aisle on a first side of the partition and a hot aisle on a second side of the partition;
    a plurality of servers arranged in the partition so that each server has an input opening positioned on the first side of the partition in communication with the cold aisle and an output opening on the second side of the partition in communication with the hot aisle, wherein the partition is arranged so that an airflow path of least resistance from the cold aisle to the hot aisle is through the servers, wherein one or more of the plurality of servers further includes a fan internal to the server and an internal fan control system, the internal fan configured to remain off until the internal fan control system identifies an air pressure difference between the input opening and the output opening exceeding a threshold difference;
    an air supply unit, located external to the plurality of servers, configured to pressurize the cold aisle relative to the hot aisle, so that air flows from the cold aisle to the hot aisle through the servers.

2. The data center system of claim 1, further comprising one or more exhaust units external to the plurality of servers configured to extract air from the hot aisle.

3. The data center system of claim 2, further comprising a cooling system coupled to the air supply unit and to the one or more exhaust units, the cooling system receiving air from the one or more exhaust units, extracting heat from the air having the second temperature to generate cold air and supplying the cold air to the air supply unit.

4. The data center system of claim 3, wherein the cooling system comprises a free-air cooling system.

5. The data center system of claim 3, wherein the cooling system includes a secondary cooling system to extract additional heat from the hot air.

6. The data center system of claim 5, wherein the secondary cooling system comprises an evaporative cooling system, an absorption cooling system, an adsorption cooling system or a vapor-compression cooling system.

7. The data center system of claim 1, further comprising one or more sensors coupled to a control system coupled to the air supply unit, the one or more sensors for monitoring an attribute of airflow through locations including the one or more sensors and the control system for generating a control signal modifying air supplied to the cold aisle by the air supply unit responsive to the attribute.

8. The data center system of claim 7, wherein the one or more sensors are positioned at locations along the partition.

9. The data center system of claim 7 where the attribute of airflow through the locations is at least one of an airflow rate, a temperature, a pressure difference between the cold aisle and the hot aisle.

10. The data center system of claim 9, wherein the control signal increases a rate at which the air supply unit supplies air to the cold aisle responsive to the airflow failing to exceed a threshold flow rate.

11. The data center system of claim 9, wherein the control signal decreases the temperature of air supplied to the cold aisle by the air supply unit responsive to the temperature reaching a threshold temperature.

12. The data center system of claim 9, wherein the control signal increases a rate at which the air supply unit supplies air to the cold aisle responsive to the pressure difference between the cold aisle and the hot aisle failing to exceed a threshold value.

13. The data center system of claim 9, wherein the control signal increases an air pressure associated with the cold aisle responsive to the pressure difference between the cold aisle and the hot aisle failing to exceed a threshold value.

14. The data center of claim 1, wherein the partition substantially blocks airflow paths from the cold aisle to the hot aisle external to the plurality of servers, directing air from the cold aisle into the input opening of each server.

15. A data center system comprising:
    a partition arranged between a cold aisle on a first side of the partition and a hot aisle on a second side of the partition;
    a plurality of servers arranged in the partition, each server comprising:
        one or more input openings on the first side of the partition in communication with the cold aisle;
        one or more output openings on the second side of the partition in communication with the hot aisle;
        an internal fan coupled to a fan control system, the internal fan remaining off until the fan control system identifies an air pressure difference between the one or more input openings and the one or more output openings exceeding a threshold difference; and
    an air supply unit located external to the plurality of servers configured to pressurize the cold aisle relative to the hot aisle so that air flows from the cold aisle to the hot aisle through the servers.

16. The data center system of claim 15, further comprising one or more exhaust units external to the plurality of servers configured to extract air from the hot aisle and a cooling system coupled to the air supply unit and to the one or more exhaust units, the cooling system receiving air from the one or more exhaust units, extracting heat from the air having the second temperature to generate cold air and supplying the cold air to the air supply unit.

17. The data center system of claim 16, wherein the cooling system comprises a free-air cooling system.

18. The data center system of claim 16, wherein the cooling system includes a secondary cooling system to extract additional heat from the hot air.

19. The data center system of claim 18, wherein the secondary cooling system comprises an evaporative cooling system, an absorption cooling system, an adsorption cooling system or a vapor-compression cooling system.

20. The data center system of claim 15, further comprising one or more sensors in locations along the partition and coupled to a control system coupled to the air supply unit, the one or more sensors configured to monitor airflow through the locations including the one or more sensors and the control system generating a control signal modifying air supplied to the cold aisle by the air supply unit responsive to the monitored airflow.

21. The data center system of claim 15, wherein the fan control system is included within a server.

22. The data center system of claim 15, wherein the fan control system comprises one or more sensors external to the plurality of server and located along the partition.

23. A method comprising:
    operating a plurality of servers, the servers arranged in a partition so that each server has an input opening positioned on a first side of the partition in communication with a cold aisle and an output opening on a second side of the partition in communication with a hot aisle;

isolating the cold aisle and the hot aisle using the partition, so that an airflow path of least resistance from the cold aisle to the hot aisle is through the servers;

pressurizing the cold aisle relative to the hot aisle using a supply of air external to the servers, so that air flows from the cold aisle to the hot aisle through the servers;

monitoring an air pressure difference between the input opening and the output opening of one or more of the plurality of servers; and responsive to the air pressure difference between the input opening and the output opening falling below a threshold difference, deactivating the internal fan included in the server.

24. The method of claim 23, further comprising:

monitoring an air flow parameter of air proximate to the first side of the partition or proximate to the second side of the partition; and responsive to the air flow parameter reaching a threshold value, increasing an amount of air supplied to the cold aisle or modifying a direction in which the supply of air provides air to the cold aisle.

25. The method of claim 24, wherein the air flow parameter comprises at least one of an air flow rate or a pressure difference between the hot aisle and the cold aisle.

26. The method of claim 23, further comprising:

monitoring an air temperature proximate to the first side of the partition or proximate to the second side of the partition; and responsive to the air temperature reaching a threshold value, increasing an amount of air supplied to the cold aisle or modifying a direction in which air is supplied to the cold aisle.

27. The method of claim 23, further comprising:

responsive to the air pressure difference between the input opening and the output opening of the server reaching a threshold value, activating an internal fan included in the server to supplement the air flowing from the cold aisle to the hot aisle through the server.

* * * * *

UNITED STATES PATENT AND TRADEMARK OFFICE
CERTIFICATE OF CORRECTION

PATENT NO. : 9,723,759 B2  
APPLICATION NO. : 12/628143  
DATED : August 1, 2017  
INVENTOR(S) : Heydari et al.

Page 1 of 1

It is certified that error appears in the above-identified patent and that said Letters Patent is hereby corrected as shown below:

In the Claims

Column 9, Line 19, after "difference;" insert -- and --.
Column 9, Line 31, delete "having the second temperature".
Column 9, Line 53, after "a temperature," insert -- or --.
Column 10, Line 36-37, after "air" delete "having the second temperature".
Column 10, Line 60, after "plurality of server" delete "server" and insert -- servers --.
Column 11, Line 12, after "deactivating" delete "the" and insert -- an --.
Column 12, Line 17, after "activating" delete "an" and insert -- the --.

Signed and Sealed this
Thirtieth Day of October, 2018

Andrei Iancu
*Director of the United States Patent and Trademark Office*